United States Patent
Gregorian et al.

(10) Patent No.: US 6,333,651 B1
(45) Date of Patent: Dec. 25, 2001

(54) SECOND ORDER DIGITAL JITTER ATTENUATOR

(75) Inventors: Roubik Gregorian, Saratoga; Shih-Chung Fan, Fremont, both of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/728,303

(22) Filed: Dec. 1, 2000

(51) Int. Cl.[7] .................................................. H03L 7/06
(52) U.S. Cl. ...................... 327/156; 327/12; 327/147; 327/105; 375/375; 375/371
(58) Field of Search .................... 327/105, 12, 2, 327/156, 147, 141, 237; 375/371, 375, 373, 372

(56) References Cited

U.S. PATENT DOCUMENTS

| | | | |
|---|---|---|---|
| 5,493,243 | * | 2/1996 | Ghoshal .................................. 327/158 |
| 5,764,709 | * | 6/1998 | Whiteside .............................. 327/12 |
| 6,121,816 | * | 9/2000 | Tonks et al. ........................... 327/12 |

* cited by examiner

*Primary Examiner*—Dinh T. Le
(74) *Attorney, Agent, or Firm*—Townsend and Townsend and Crew LLP

(57) ABSTRACT

A phase detector which detects the phase difference between the input clock and an output clock. That phase difference is used to gate a high frequency clock, which is provided to an integration circuit. The phase detector also indicates whether the phase difference is positive or negative. The output of the integration circuit is provided to a comparator, which compares the value to a threshold. When the threshold is exceeded, an advance or retard signal is provided to a phase selector. The phase selector selects one of multiple phases of a clock used for the output clock.

7 Claims, 3 Drawing Sheets

SECOND ORDER DIGITAL JITTER ATTENUATOR

BACKGROUND OF THE INVENTION

The present invention relates to jitter attenuators.

Jitter attenuators are used to compensate for phase variations in an input signal. Uncompensated jitter can be a significant source of error. In transmission systems such as T3 and E3, the clock is encoded with the data. A receiver will extract the clock from the coded datastream and provide the extracted clock and data itself This clock can then be used to retransmit the data to the next node. Jitter is obviously undesirable since any phase variation of the clock can be passed along from node to node.

There are many causes of jitter. For example, the transmission media may transmit higher frequency portions of the signal faster than lower frequency portions.

Typically, the received clock is filtered and smoothed to remove the jitter. An elastic buffer, such as a FIFO, is sometimes used to buffer the difference in rates of the received jittery clock and the retransmitted data. See, for example, U.S. Pat. No. 5,090,025.

Another example of a jitter attenuator is shown in U.S. Pat. No. 5,493,243. This patent shows using an up/down counter and a subsequent decoder to control the digital frequency synthesizer. The input clock is used to decrement the counter, while the output, divided-down clock is used to increment the counter. Each change in the count causes a change in the phase of the synthesized frequency.

It would be desirable to have a digital jitter attenuator which corrects for jitter, but which corrects slowly enough to avoid tracking phase variations which are transient.

SUMMARY OF THE INVENTION

The present invention provides a phase detector which detects the phase difference between the input clock and an output clock. That phase difference is used to gate a high frequency clock, which is provided to an integration circuit. The phase detector also indicates whether the phase difference is positive or negative. The output of the integration circuit is provided to a comparator, which compares the value to a threshold. When the threshold is exceeded, an advance or retard signal is provided to a phase selector. The phase selector selects one of multiple phases of a clock used for the output clock.

In one embodiment, the integration circuit has first and second integrators. The phase detector output is provided to the first integrator. The output of the first integrator is provided to an adder. The other input of the adder is the output of the phase detector scaled through a first scaling circuit. A second scaling factor is applied to the phase detector output. The adder output is then provided through a second integrator, with the output of the second integrator being provided to the comparator. This integration will result in minimizing any frequency offset.

To the extent jitter is self-offsetting, or corrects it on the next or a close pulse, the present invention will not change the output phase. For example, a positive integrated value may be offset by a subsequent negative integrated value. It is only when the total integrated value reaches a preselected threshold (positive or negative) that the output clock phase is adjusted. This ensures that the phase jitter is not transient. However, the threshold is selected low enough so that true jitter is compensated for sufficiently quickly.

In one preferred embodiment, the invention uses a multiple phase clock generator operating off of a high frequency clock. One of the clock phases generated is selected by a phase selector connected to the output of the comparator. The selected clock is then divided down to the frequency of the input clock. The same high frequency clock used to generate the multiple phases is also used for the input phase detector.

For a further understanding of the nature and advantages of the invention, reference should be made to the following description taken in conjunction with the accompanying drawings.

DESCRIPTION OF THE SPECIFIC EMBODIMENTS

Figure 1:
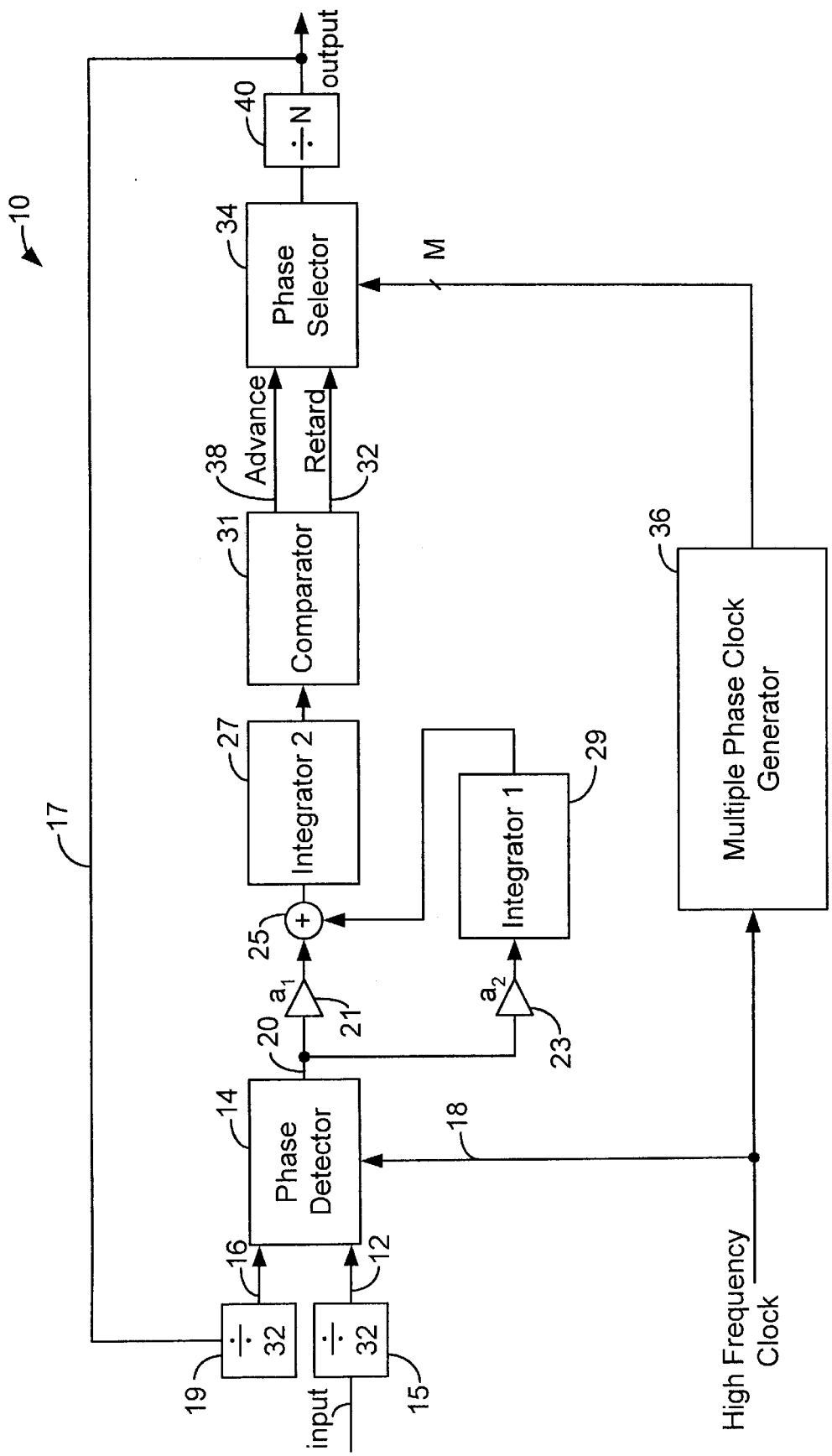
FIG. 1 is a block diagram of an embodiment of the present invention.

FIG. 1 shows a jitter attenuator circuit 10 according to an embodiment of the invention. An input is provided through a divider 15 (divide by 32) on a line 12 to a phase detector 14. The input is a T3/E3 clock recovered from a received signal. The input could alternately be another communication signal. In one embodiment, the present invention could be used in a transceiver, such as a T3/E3 transceiver. A second input to phase detector 14 on line 17 is an output clock signal after jitter correction, provided through a divider 19 (divide by 32) to input line 16. This is fed back from the output of the circuit of FIG. 1.

A high frequency clock signal is provided on a line 18. The high frequency clock is preferably selected to have a frequency which is a multiple of the input frequency used.

The phase detector provides an output on a line 20 to the integration circuitry including integrators #1 and #2. The output on line 20 is provided to a first scaling factor circuit 21, and then to an adder 25. It is also provided through a second scaling factor circuit 23 to a first integrator 29. The output of integrator 29 is added back in adding circuit 25, with the output then being provided to a second integrator 27.

Figure 2:
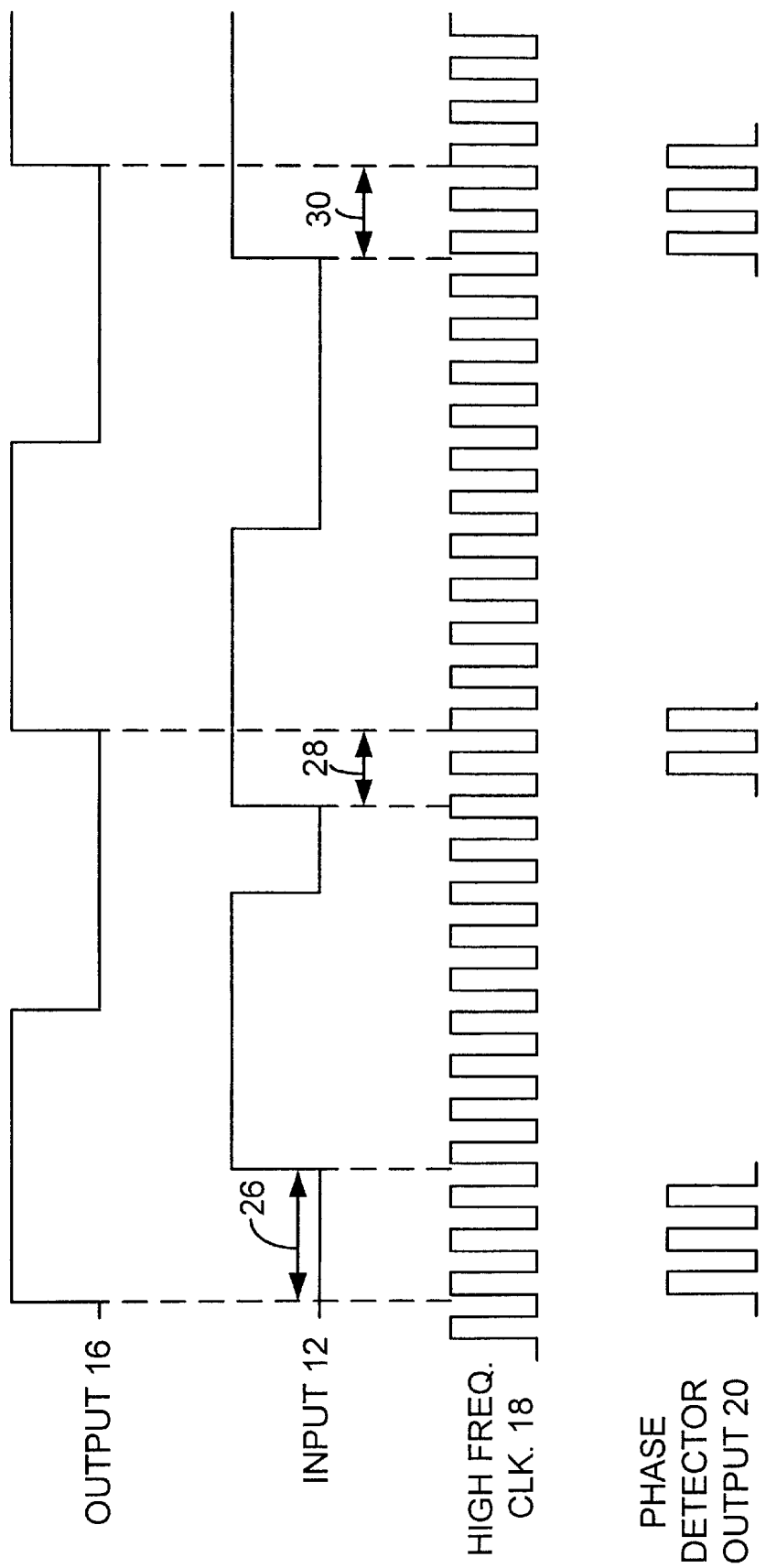
FIG. 2 is a timing diagram illustrating the operation of the embodiment of FIG. 1.

An example of the operation is illustrated by the signals in FIG. 2. The signals shown are the output clock 16 and input clock 12. Also shown is the high frequency clock 18. The phase detector detects the difference between the rising edges of the clocks on lines 12 and 16. This difference is indicated by arrows 26. This performs a gating of the high frequency clock 18, allowing three pulses in the example shown to be gated through to output line 20 and integrated.

A subsequent difference in rising edges is shown by arrows 28. Here, the difference is negative, since the rising edge of the clock on the input line 12 is ahead of the output clock on line 16. As shown, two clock pulses of the high frequency clock are gated through. A negative value is applied to the integrators.

Subsequently, as shown by arrows 30, the phase difference continues to be negative, by an amount of 3. If this continues, this shows a jitter which is not transient. Once the integrated negative value reaches a predetermined threshold, as determined by comparator 31, a retard signal can be provided on an output line to phase selector 34 as shown in FIG. 1. This will cause the phase selector to select a phase of the output clock which is retarded from that shown as output 16 in FIG. 2. This should close the phase difference gap.

The double integration provides a measure of the cumulative value of the phase difference. Thus, a change in phase can be caused either by a large difference for a short time, or a small difference which persists for a long time. By separating the first integrator into a parallel path, the circuit can control, through the scaling factors, the amount of the phase difference which is integrated. The portion which is integrated through scale factor circuit 21 is in effect subject to only a single integration.

Integrator #2 provides a first order integration which reduces jitter. Integrator #1 provides compensation for frequency offsets, which require longer term correlation and an essentially constant offset.

The phase selector 34 selects one of multiple phases of a clock signal from a multiple phase clock signal generator 36. As shown, M outputs of clock generator 36 are provided to phase selector 34. In one embodiment of the invention, M is 5. Clock generator 36 receives its input from the same high frequency clock line 18 that is provided to phase detector 14. The high frequency clock in one embodiment is 8 times the frequency of the input clock.

If the phase difference were to be positive, an advance signal would be output from comparator 31 on a line 38 to phase selector 34. The output of phase selector 34 is provided to a divide by N frequency divider 40, which divides the high frequency clock down to the same frequency as the input clock.

An advantage of the invention is that the circuit can be designed and analyzed in the Z domain using a DSP (Digital Signal Processing) approach. The jitter transfer function is:

$$\frac{(a1+a2)z - a1}{z^2 - z(2-a1-a2) + 1 - a1}$$

In one embodiment, phase selector 34 can be a multiplexer for multiplexing the various M phases of the clock, with logic selection circuitry controlled by the advance and retard signals on lines 32 and 38. In one embodiment, each advance or retard signal selects the next phase clock.

Figure 3:
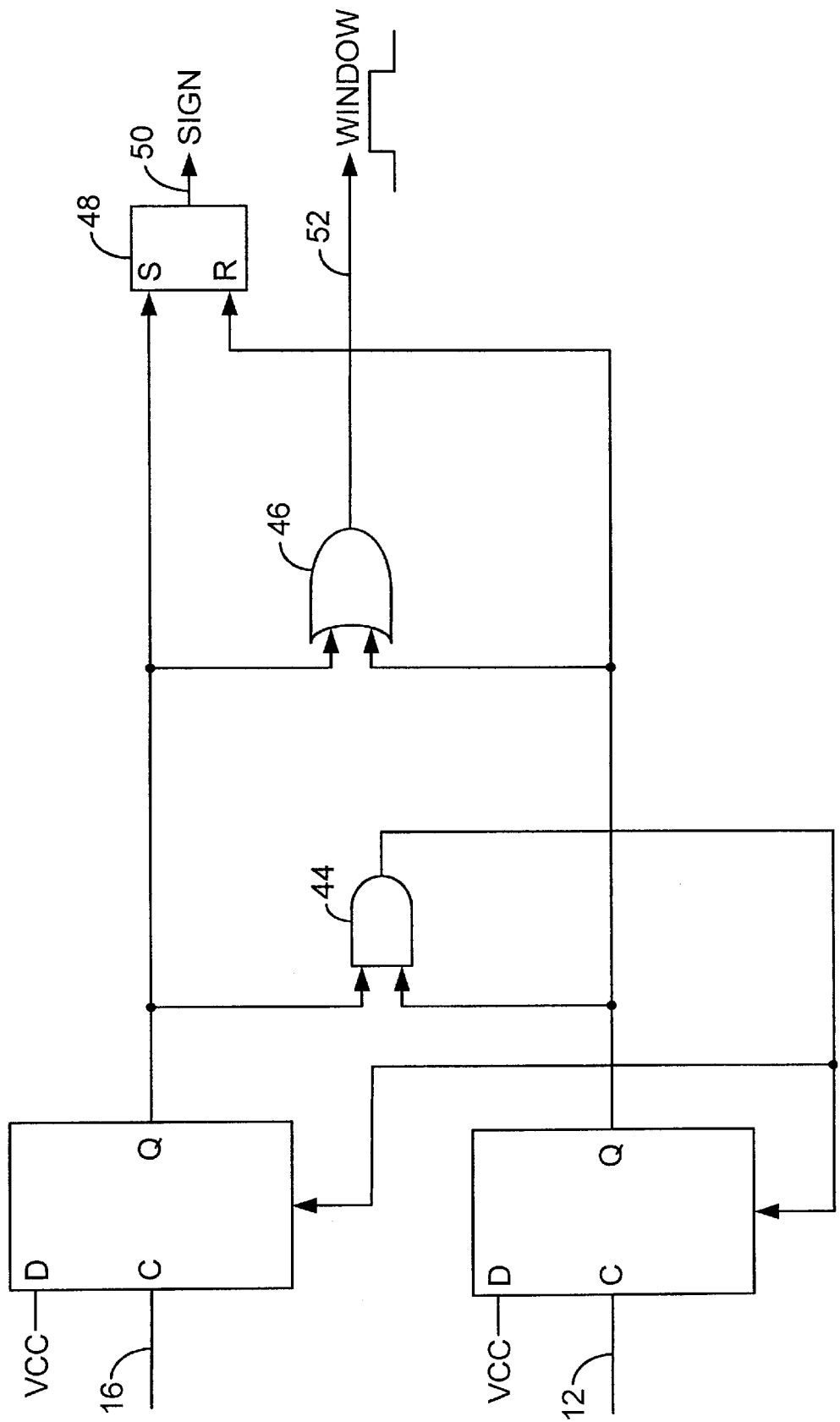
FIG. 3 is a diagram of one embodiment of the phase detector of FIG. 1.

FIG. 3 is one embodiment of a phase detector circuit. A pair of flip-flops 40 and 42 are used, with outputs connected to AND gate 44 and OR gate 46. The sign of the output is provided through latch 48 on line 50, while line 52 provides a window which gates the pulses from the high frequency clock on line 18.

Alternately, other logic may be used as would be apparent to one of skill in the art.

In one embodiment, the scaling factor for scaling circuit 21 is $2^{-12}$ and the scaling factor for scaling factor 23 is $2^{-29}$. The smaller scaling factor is used for the integrator #1 input so that the circuit will not change quickly. Typically, in a T3 or E3 environment, a larger frequency offset must be tolerated compared to a T1/E1 environment (relative to jitter cutoff frequency).

In one embodiment, the comparator can simply be the most significant bit (MSB) and the sign bit, which can be used to trigger the retard or advance. No actual comparison circuit is necessary in this embodiment. The integrator can be implemented as an adder. Integrator #1 can be thought of as storing information for the frequency offset.

In a first order digital jitter attenuator, the frequency offset is compensated by a constant phase offset. This limits the allowable frequency offset of the incoming signal. A second order jitter attenuator, as in the present invention, uses a second integrator to store the frequency offset information. The phase offset can therefore be substantially eliminated.

As will be understood by those of skill in the art, the present invention may be embodied in other specific forms without departing from the essential characteristics thereof. For example, the phase selector could select the multiple phases of a clock signal after they have been frequency-divided, rather than before. The specific scaling factors could be varied depending upon the application. Alternately, instead of selecting the next phase from the multiple phase clock generator, one or more phases could be skipped, such as where the count is reached very quickly, indicating a larger correction is required. Accordingly, the foregoing description is intended to be illustrative, but not limiting, of the scope of the invention which is set forth in the following claims.

What is claimed is:

1. A digital jitter attenuator circuit comprising:
   a phase detector having a first input coupled to an input line, and a second input coupled to an output line;
   a first integrator coupled to an output of said phase detector;
   a comparator coupled to an output of said first integrator;
   a phase selector coupled to an output of said comparator to select one of multiple phases of a high frequency clock;
   a multiple phase clock generator coupled to receive said high frequency clock and having M outputs connected as inputs to said phase selector; and
   a divider coupled to an output of said phase selector, an output of said divider being said output line.

2. The circuit of claim 1 further comprising:
   an adder coupled to said output of said phase detector, an output of said first integrator being coupled to said adder; and
   a second integrator coupled between an output of said adder and said comparator.

3. The circuit of claim 2 further comprising:
   a first scaling circuit coupled to an input of said adder; and
   a second scaling circuit coupled to an input of said first integrator.

4. The circuit of claim 1 wherein said comparator is configured to produce both advance and retard output signals for advancing or retarding the phase of said output signal.

5. A second order digital jitter attenuator circuit comprising:
   a phase detector having a first input coupled to an input line, and a second input coupled to an output line;
   first and second scaling circuits coupled to an output of said phase detector;
   an adder coupled to an output of said first scaling circuit;
   a first integrator coupled to an output of said second scaling circuit, an output of said first integrator being coupled to said adder;
   a second integrator coupled to an output of said adder;
   a comparator coupled to an output of said second integrator;
   a phase selector coupled to an output of said comparator to select one of multiple phases of a high frequency clock;
   a multiple phase clock generator coupled to receive said high frequency clock and having M outputs connected as inputs to said phase selector; and
   said divider coupled to an output of said phase selector, an output of said divider being said output line.

6. A method for digitally attenuating jitter comprising:

generating M multiple phase clocks from a high frequency clock;

generating a phase detection signal with a phase difference between an input signal and an output signal;

integrating said high frequency clock during said phase difference;

comparing an integrated signal to a threshold;

providing an advance/retard signal when said threshold is exceeded; and selecting a phase of said M multiple phase clocks in response to said advance/retard signal.

7. The method of claim 6 further comprising dividing down a selected one of said multiple phase clocks.

* * * * *